US008816781B2

(12) United States Patent  
Huynh

(10) Patent No.: US 8,816,781 B2  
(45) Date of Patent: Aug. 26, 2014

(54) APPARATUS AND METHOD TO DETECT FREQUENCY DIFFERENCE

(71) Applicant: Phuong Huynh, Fairfax, VA (US)

(72) Inventor: Phuong Huynh, Fairfax, VA (US)

(73) Assignee: Phuong Huynh, Fairfax, VA (US)

( * ) Notice: Subject to any disclaimer, the term of this patent is extended or adjusted under 35 U.S.C. 154(b) by 103 days.

(21) Appl. No.: 13/623,380

(22) Filed: Sep. 20, 2012

(65) Prior Publication Data

US 2014/0077887 A1   Mar. 20, 2014

(51) Int. Cl.
 *H03L 7/00* (2006.01)
 *H03L 7/091* (2006.01)
 *H03L 7/089* (2006.01)

(52) U.S. Cl.
 CPC ............... *H03L 7/089* (2013.01); *H03L 7/091* (2013.01)
 USPC ............... 331/25; 331/1 A; 331/1 R; 331/34; 331/44; 331/175; 327/37; 327/39; 327/47; 327/49; 327/159

(58) Field of Classification Search
 CPC .......... H03L 7/087; H03L 7/089; H03L 7/091
 USPC ................. 331/1 R, 25, 34, 44, 175, 1 A, 12; 327/37, 39, 47, 49, 159
 See application file for complete search history.

(56) References Cited

U.S. PATENT DOCUMENTS

| | | | |
|---|---|---|---|
| 5,841,388 A | 11/1998 | Yasuda et al. | |
| 5,953,636 A | 9/1999 | Keate et al. | |
| 6,275,540 B1 | 8/2001 | Barrett, Jr. et al. | |
| 7,324,615 B2 | 1/2008 | Lourens et al. | |
| 7,403,073 B2 * | 7/2008 | Kossel et al. | 331/16 |
| 2003/0021367 A1 | 1/2003 | Smith | |
| 2005/0069056 A1 | 3/2005 | Willingham | |
| 2006/0007929 A1 | 1/2006 | Desai et al. | |

\* cited by examiner

*Primary Examiner* — Arnold Kinkead  
*Assistant Examiner* — Richard Tan

(57) ABSTRACT

An all-digital frequency detector is provided, which includes a phase-frequency detector receiving a reference clock and an input clock, two sample/hold circuits sampling the phase-frequency detector outputs responsive to a ninety-degree phase shifted reference clock and a ninety-degree phase shifted input clock, a plurality of logical operators to generate an output frequency detection signal and a output clock responsive to the difference between the reference clock and the input clock.

6 Claims, 5 Drawing Sheets

FIG. 1 —PRIOR ART—

APPARATUS AND METHOD TO DETECT FREQUENCY DIFFERENCE

FIELD OF THE INVENTION

The present invention relates in general to frequency detection, oscillator tuning, and frequency and phase locked loop.

BACKGROUND OF THE INVENTION

Phase-locked-loop (PLL) applications typically provide a synchronous output clock signal by comparing it to a reference clock signal. A phase-frequency detector (PFD) circuit is often employed to provide an analog control signal to a loop filter. The PFD circuit provides the control signal in response to a comparison of the phase and frequency of the output clock signal to the reference clock signal. A voltage-controlled oscillator (VCO) is arranged to receive its control signal from the loop filter. The VCO produces the clock signal in response to the control signal such that the frequency of the clock is varied until its phase and frequency are matched to the reference clock signal.

Another technique often used in communication systems to provide frequency lock to a reference signal is the quadricorrelator, or a frequency detector. FIG. 1 is a block diagram of an exemplary topology, illustrating the functioning of the quadricorrelator, which includes three mixers 103, 105 and 117, two low-pass filters 111 and 113, a differentiator 115, and a reference clock generator 109 with a ninety degree phase shifter 107 to generate the in-phase and quadrature reference clocks. The input signal, $SIN(w_i t)$ is multiplied with the in-phase and quadrature reference clocks, $SIN(w_{REF} t)$ and $COS(w_{REF} t)$, via the mixers 103 and 105 to generate the corresponding in-phase and quadrature baseband components. The low-pass filters 111 and 113 suppress the unwanted component $w_i + w_{REF}$ and pass the $w_i - w_{REF}$ component. The in-phase component is differentiated by 115 and multiplied with the quadrature component via the mixer 117 to generate an analog voltage that is proportional to the difference between the input frequency and the reference frequency. However, the quadricorrelator has a limited frequency capture range, and is not suitable in many oscillator tuning circuits.

A phase-frequency detector (PFD) as illustrated in FIG. 2 is capable of both locking the phase and frequency of the input clock to a reference clock. The PFD comprises two flip-flops 205 and 209, and an AND logic gate 207. It provides UP and DOWN signals in response to a comparison between the input clock signal and the reference clock signal. The UP signal is active when the frequency of the input clock signal is low, while the DOWN signal is active when the frequency of the input clock signal is high. Similarly, the UP signal is active when the phase of the input clock is lagging behind the phase of the reference clock, and the DOWN signal is active when the phase of the input clock is leading the phase of the reference clock. The PFD has a much wider frequency capture range as compared to the quadricorrelator, and has been widely used in modern phase-locked loop applications. However, the PFD does not provide instantaneous true frequency detection, since only the average of the UP and DOWN signals can provide the frequency detection over time.

SUMMARY OF THE INVENTION

In view of the analog nature of the phase locked loop due to the charge pump and the loop filter and the limited capture range of the quadricorrelator, it is an object of this invention to simplify frequency detection and control by restricting it to the digital domain only, using circuitry comprising only logic gates, and in which the charge pump and analog loop filter are removed. An all-digital frequency locked loop can provide significant advantages in terms of cost and area saving in modern CMOS semiconductor processes.

This invention features circuit for tuning a digital-controlled oscillator comprising a frequency detector circuit configured to receive a reference clock having a reference frequency and a feedback clock having a feedback frequency, and generate a frequency detection signal and a control clock; a digital-controlled oscillator configured to generate the feedback clock based on the frequency detection signal and the control clock, wherein the frequency detection signal has a first value when the reference frequency is greater than the feedback frequency, and has a second value when the reference frequency is lower than the feedback frequency, wherein the digital-controlled oscillator is configured to use the control clock to trigger a frequency update in the feedback clock, and wherein a control frequency of the control clock is configured to decrease as the input clock frequency approaches the reference clock frequency.

Furthermore, the frequency detector comprises a phase-frequency detector configured to generate first and second frequency indication signals in response to the reference clock and the feedback clock, wherein the first frequency indication signal being active when an input phase of the input clock lags behind a reference phase of the reference clock, and the second frequency indication signal being active when the input phase leads the reference phase; a first ninety-degree phase shifter configured to generate a first phase-shifted signal in response to the reference clock; a second ninety-degree phase shifter configured to generate a second phase-shifted signal in response to the feedback clock; a first sample/hold circuit configured to sample and hold the first frequency indication signal as a first sample/hold signal, using the first phase-shifted signal as a first sample clock; a second sample/hold circuit configured to sample and hold the second frequency indication signal as a second sample/hold signal, using the second phase-shifted signal as a second sample clock; a first inverter configured to invert the first sample/hold signal; a second inverter configured to invert the second sample/hold signal; a first switch configured to pass the first sample/hold signal as a first latching signal, responsive to the second sample/hold signal; a second switch configured to pass the inverted second sample/hold signal as a second latching signal, responsive to the first sample/hold signal; an AND gate configured to perform an AND operation on the inverted first sample/hold signal and the inverted second sample/hold signal, to generate an AND signal; a latch circuit configured to latch one of the first and second latching signals as the frequency detection signal, responsive the AND signal; a multiplexer configured to provide one of the first and second sample/hold signals as the output clock, responsive to the frequency detection signal, wherein the multiplexer is configured to provide the first sample/hold signal as the output clock when the frequency detecting signal has a first value, and wherein the multiplexer is configured to provide the second sample/hold signal as the output clock when the frequency detecting signal has a second value.

Furthermore, in the frequency detector, when the first switch is closed, the first sample/hold signal is passed as the first latching signal, when the second sample/hold signal has a first value. On the other hand, the first switch is open when the second sample/hold signal has a second value. Likewise, when the second switch is closed, the second sample/hold signal is passed as the first latching signal, when the first sample/hold signal has the first value. On the other hand, the second switch is open when the first sample/hold signal has the second value.

This invention also features a method for tuning a digital-controlled oscillator comprising receiving a reference clock signal; receiving a feedback clock signal from the digital-controlled oscillator; generating an error signal and a control clock signal in response to the difference between a reference frequency of the reference clock signal and a feedback frequency of the feedback clock signal; generating the feedback clock signal in response to the error signal and the control clock signal; wherein the error signal has a first value when the reference frequency is greater than the feedback frequency, and the error signal has a second value when the reference frequency is lower than the feedback frequency; and wherein a control frequency of the control clock signal is proportional to the difference between the reference frequency and the feedback frequency.

Furthermore, the generating of the error signal and the clock signal further includes generating a first phase and frequency error signal based on the difference between the reference clock signal and the feedback clock signal; generating a second phase and frequency error signal based on the difference between the reference clock signal and the feedback clock signal; shifting the first reference clock by ninety-degrees to generate a first phase shifted clock signal; shifting the second reference clock by ninety-degrees to generate a second phase shifted clock signal; generating a first sample/hold signal based on the first phase and frequency error signal and the first phase shifted clock signal; generating a second sample/hold signal based on the second phase and frequency error signal and the second phase shifted clock; inverting the first sample/hold signal; inverting the second sample/hold signal; generating a first switch signal based on the first and second sample/hold signals; generating a second switch signal based on the first sample/hold signal and said first logically inverted signal; performing an AND operation on the inverted first sample/hold signal and the inverted second sample/hold signal to generate an AND signal; generating the error signal based on the first and second switch signals and the AND signal; generating the control clock signal based on the first and second sample/hold signals and the error signal.

Furthermore, in the generating of the error signal and the clock signal, the control clock is set to be the first sample/hold signal when the error signal has a first value, and the control clock is set to be the second sample/hold signal when the error signal has a second value. Also, the error signal has a first value when the first switch signal had a high value more recently than the second switch signal had the high value, and the error signal has a second value when the second switch signal had the high value more recently than the first switch signal had the high value.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

In overview, the present disclosure concerns electronic devices or units, some of which are referred to as communication units, such as cellular phones or two-way radios and the like, typically having a capability for rapidly handling data, such as can be associated with a communication system such as an Enterprise Network, a cellular Radio Access Network, or the like. More particularly, various inventive concepts and principles are embodied in circuits, and methods therein for receiving signals in connection with a communication unit.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with in integrated circuits (ICs), such as a digital signal processor or application specific ICs. It is expected that one of ordinary skill, notwithstanding possibly significant effort and many design choices motivated by, for example, available time, current technology, and economic considerations, when guided by the concepts and principles disclosed herein will be readily capable of generating ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Figure 3:
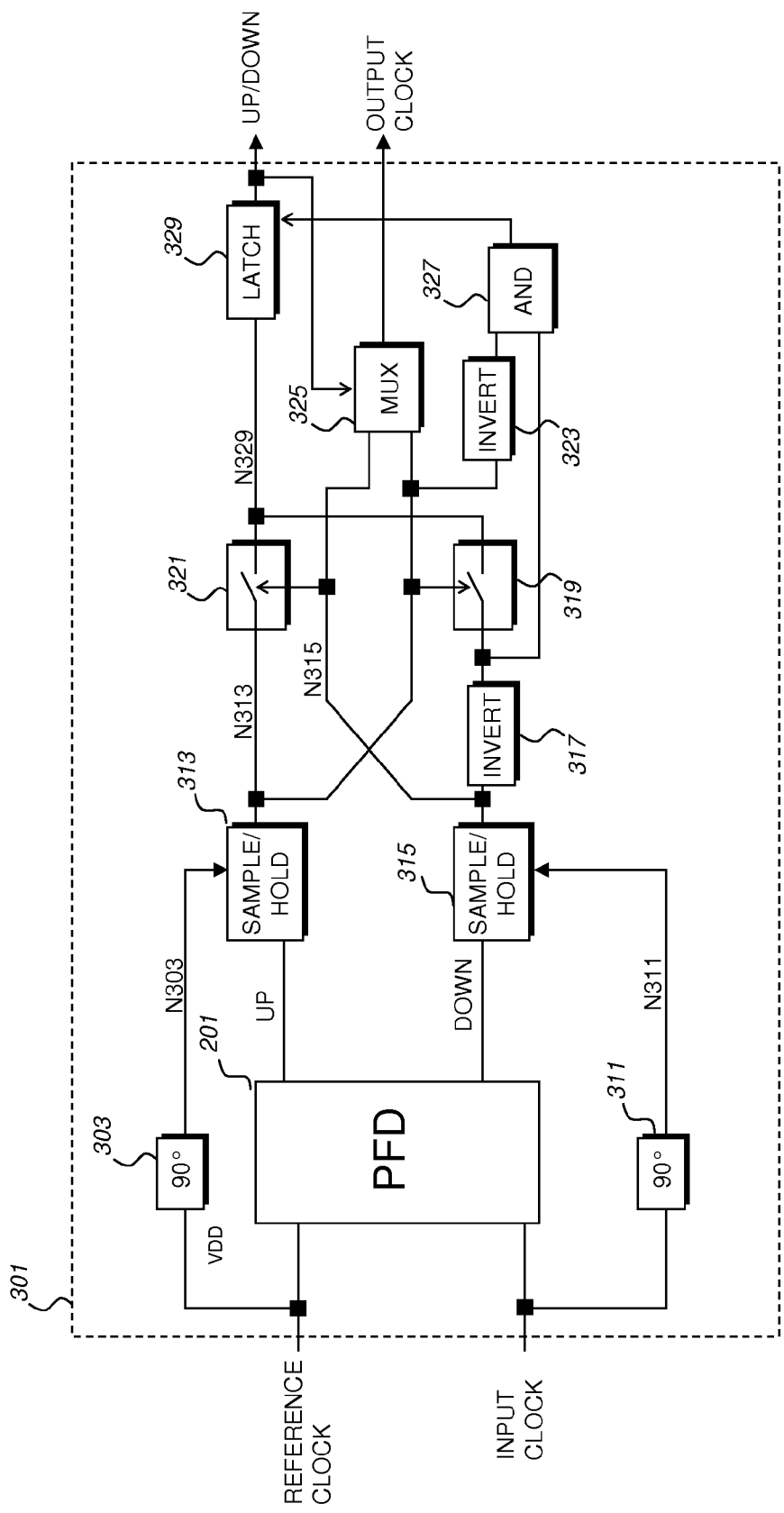
FIG. 3 is a schematic diagram illustrating an exemplary frequency detector circuit according to disclosed embodiments.

Referring now to FIG. 3, a schematic diagram illustrating an exemplary frequency detector circuit in accordance with disclosed embodiments will be discussed and described. In overview, the all-digital frequency detector includes a phase-frequency detector (PFD) 201, first and second ninety-degree phase shifters 303 and 311, first and second sample/holds 313 and 315, first and second inverters 317 and 323, first and second switches 319 and 321, a multiplexer (MUX) 325, an AND gate 327, and a latch 329.

Figure 1:
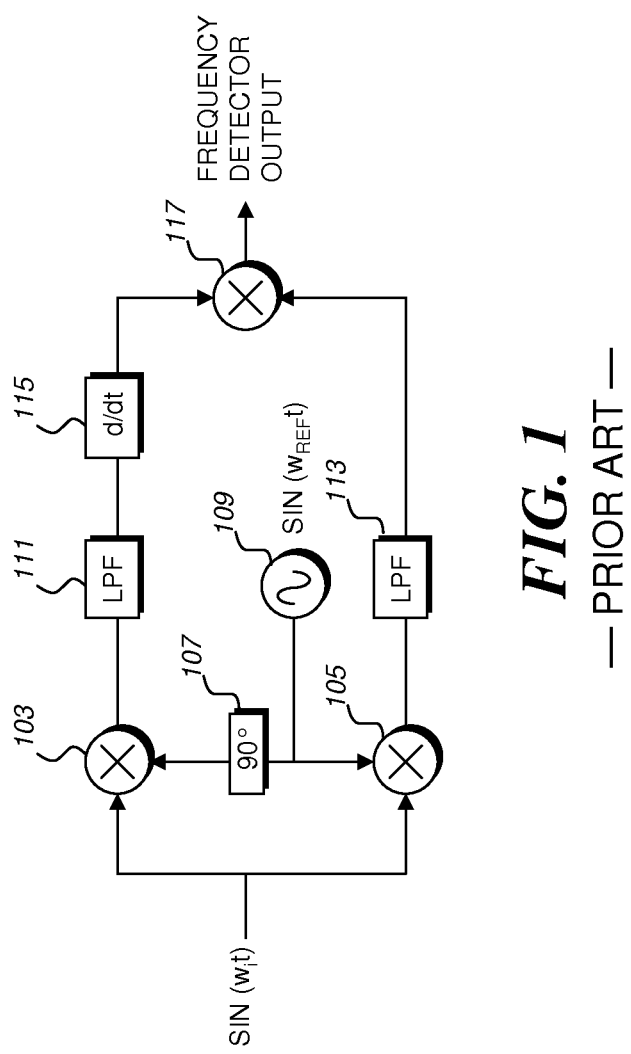
FIG. 1 is a schematic diagram illustrating a conventional frequency detector.
Figure 2:
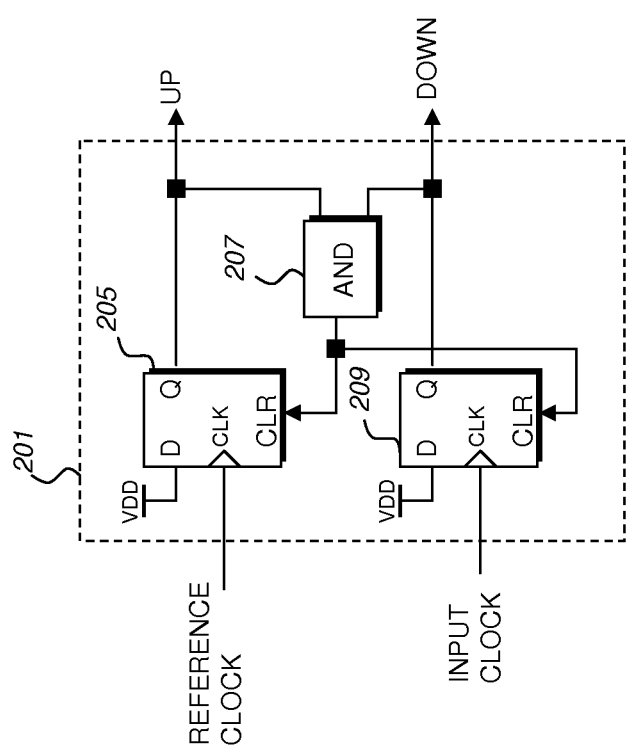
FIG. 2 is a schematic diagram illustrating a conventional phase frequency detector circuit.

The PFD 201 receives a reference clock and an input clock and provides UP and DOWN signals, as described above with respect to FIG. 2.

The first ninety-degree phase shifter 303 operates to shift the reference clock by ninety degrees. Likewise, the second ninety-degree phase shifter 311 operates to shift the input clock by ninety degrees.

The first sample/hold 313 operates to remove high-frequency content of the UP signal using the output of the first ninety-degree phase shifter 303 as a first sample clock. Likewise, the second sample/hold 315 operates to remove high-frequency content of the DOWN signal using the output of the second ninety-degree phase shifter 311 as a second sample clock.

The first inverter 317 operates to invert the output of the second sample/hold 315, and provides the result to the first switch 319 and the AND gate 327.

The first switch 319 passes the output of the inverter 317 as a first switch signal, using the output of the first sample/hold 313 as a control signal. In particular, when the output of the first sample/hold 313 is high, the first switch 319 is closed; and when the output of the first sample/hold 313 is low, the first switch 319 is opened.

The second switch 321 passes the output of the first sample/hold 313 as a second switch signal, using the output of the second sample/hold 315 as a control signal. In particular, when the output of the second sample/hold 315 is high, the second switch 321 is closed; and when the output of the second sample/hold 315 is low, the second switch 321 is opened.

Because the first switch 319 is controlled by the output of the first sample/hold 313, and the second switch 321 is controlled by the output of the second sample/hold 315, the first and second switches will not both be closed at the same time. This is because the UP and DOWN signals, which are the inputs of the first and second sample/holds 313, 315, respectively, will never both have a high value at the same time.

The second inverter 323 operates to invert the output of the first sample/hold 313, and provides the result to the AND gate 327.

The multiplexer 325 selects one of the output of the first sample/hold 313 and the output of the second sample/hold 315 as a control clock (OUTPUT CLOCK), based on a frequency detection signal (UP/DOWN signal) output from the latch 329. In particular, when the UP/DOWN signal is high, the multiplexer 325 selects the output the first sample/hold 313; and when the UP/DOWN signal is low, the multiplexer 325 selects the output of the second sample/hold 315.

The AND gate 327 operates to perform an AND operation on the inverted output of the first sample/hold 313 received from the second inverter 323, and the inverted output of the second sample/hold 315 received from the first inverter 317.

The latch 329 operates to latch the output of either the first switch 319 or the second switch 321 as an UP/DOWN signal in response to the output of the AND gate 327. The signal latched by the latch 329 depends on which of these switches 319, 321 is closed. As noted above, the first and second switches 319, 321 will never both be closed at the same time; but the latch 329 is activated when the first and second switches 319, 321 are opened.

Figure 4:
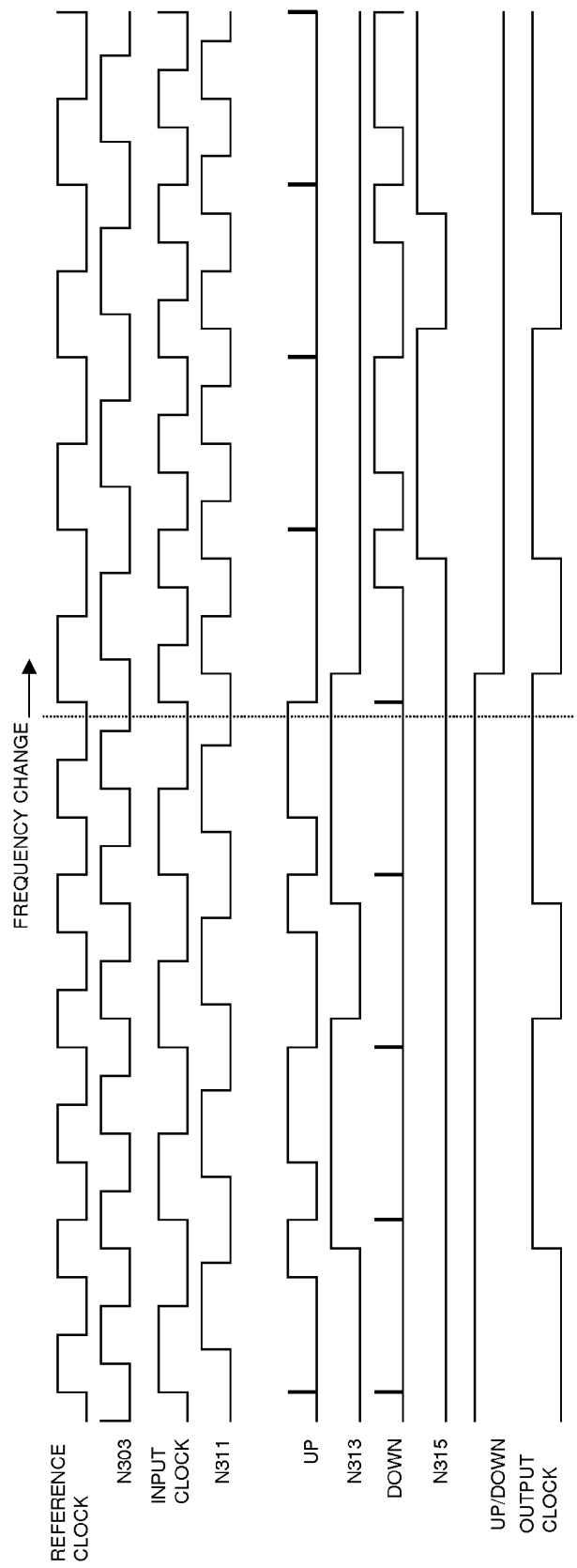
FIG. 4 is a schematic diagram illustrating the timing diagram in accordance with the exemplary frequency detector circuit.

FIG. 4 illustrates the timing diagram of various intermediate signals in FIG. 3. As shown in FIG. 4, the input clock frequency is neither phase-locked nor frequency-locked to the reference clock. The UP and DOWN signals of the PFD 201 will indicate the direction for frequency control.

As further shown in FIG. 4, when the reference clock frequency is higher than the input clock frequency, the UP signal has a higher average value than the DOWN signal; whereas the reverse is true when the input clock frequency is higher than the reference frequency. Averaging UP and DOWN is suitable for use with an analog charge pump and loop filter, but not in a pure digital domain control. However, if UP and DOWN are re-sampled by a 90-degree shifted reference clock N303 and a 90-degree shifted input clock N311, respectively, the high-frequency contents will be removed at the sample/hold 313 and 315 outputs; i.e. first sample/hold signal N313 and second sample/hold signal N315, respectively. If the input clock has a lower frequency than the reference clock, signal, the second sample/hold signal N315 has logic level 0 while the first sample/hold signal N313 toggles between logic 0 and 1. On the other hand, if the input clock frequency is higher than the reference clock frequency, the first sample/hold signal N313 stays at logic level 0, while the second sample/hold signal N315 toggles between logic 0 and 1. By virtue of the bandpass sampling theory, the frequency of the sample/hold 313 and 315 signals, if they toggle at all, is the difference between the input clock frequency and the reference frequency.

The first and second sample/hold signals N313, N315 from the first and second sample/holds 313, 315, respectively, can be combined to indicate the direction of the frequency detection, via the UP/DOWN output signal. A logic high at the UP/DOWN signal indicates increasing the input clock frequency, while a logic low at the UP/DOWN signal dictates decreasing the input clock frequency.

As noted, a combination of the logic signal inverter 317 and the switches 319 and 321 can generate the desired UP/DOWN signal. When the input clock has a lower frequency than the reference clock, the second sample/hold signal N315 stays at logic low, turning off the switch 321, while first sample/hold signal N313 toggles between high and low. When the first sample/hold signal N313 is high, the first switch 319 is turned on, allowing the inverted second sample/hold signal N315, which is a logic high level, to serve as the latch input signal N329. The latch input signal N329 is then latched at the latch 329 to form the UP/DOWN signal.

The latch 329 is used to retain the UP/DOWN signal at the current logic value of signal N329 when both switches 321 and 319 are turned off; i.e. both the first and second sample/hold signals N313 and N315 are low. This is accomplished by using the output of the AND gate 327 as the control signal for the latch 329. Therefore, it is seen that UP/DOWN is high when the input clock has a lower frequency than the reference clock.

On the other hand, when the input clock has a higher frequency than the reference clock, the first sample/hold signal N313 is set low while the second sample/hold signal N315 toggles between high and low. The first switch 319 is then turned off, while the second switch 321 is turned on when second sample/hold signal N315 is high. This allows the first sample/hold signal N313, which has a logic low level, to serve as the latch input signal N329 and, through the latch 329, the UP/DOWN signal.

Likewise, the latch 329 will retain the UP/DOWN signal at the logic low level even when the second sample/hold signal N315 toggles to low; thereby turning off the switch 321. As a result, the UP/DOWN output signal retains a low value when the input clock frequency is higher than the reference clock frequency.

The toggling of the first and second sample/hold signals N313 and N315 can be used as an output clock for frequency updating control. The UP/DOWN signal is used to select the proper toggling signal, either the first or second sample/hold signals N313 or N315, via the multiplexer 325, depending on whether the input clock frequency is lower or higher than the reference clock frequency, respectively.

Figure 5:
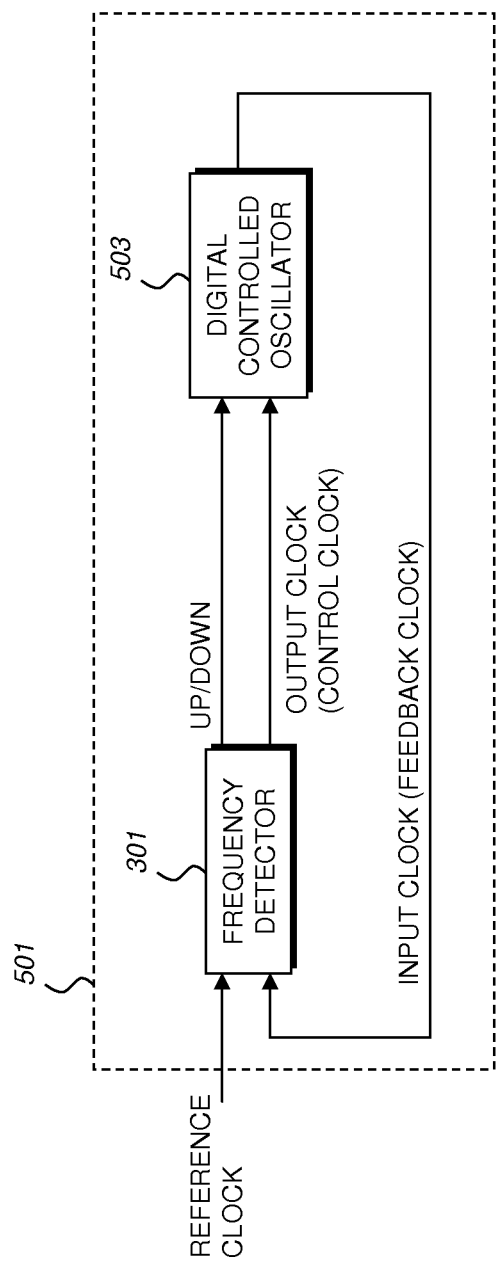
FIG. 5 is a schematic diagram illustrating an exemplary oscillator tuning system that employs a frequency detector circuit, in accordance with the present invention.

FIG. 5 illustrates an exemplary all-digital frequency-locked loop arranged in accordance with the disclosed embodiments. The frequency detector 301 receives a reference clock and a feedback clock from the digital-controlled oscillator 503. The UP/DOWN signal from the frequency detector 301 dictates whether the oscillator frequency should be increased or decreased depending on whether the oscillator frequency is lower or higher than the reference frequency, respectively. The OUTPUT CLOCK signal from the frequency detector 301 can be used to trigger the frequency update on the digital-controlled oscillator 503. As the frequency of the signal OUTPUT CLOCK decreases when the input clock frequency approaches the reference clock frequency, the frequency update rate will become slower and slower, indicating a first order dynamic settling of the frequency detector loop.

It should be noted that the term communication unit may be used herein to denote a wired device, for example a high speed modem, an xDSL type modem, a fiber optic transmission device, and the like, and a wireless device, and typically a wireless device that may be used with a public network, for example in accordance with a service agreement, or within a private network such as an enterprise network or an ad hoc network. Examples of such communication devices include a cellular handset or device, television apparatus, personal digital assistants, personal assignment pads, and personal computers equipped for wireless operation, and the like, or equivalents thereof, provided such devices are arranged and constructed for operation in connection with wired or wireless communication.

The communication units of particular interest are those providing or facilitating voice communications services or data or messaging services normally referred to as ultra wideband networks, cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks, LTE (Long Term Evolution) networks, and variants or evolutions thereof Furthermore, the wireless communication devices of interest may have short range wireless communications capability normally referred to as WLAN (wireless local area network) capabilities, such as IEEE 802.11, Bluetooth, WPAN (wireless personal area network) or Hyper-Lan and the like using, for example, CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication devices of interest may be connected to a LAN using protocols such as TCP/IP, UDP/UP, IPX/SPX, or Net BIOS via a hardwired interface such as a cable and/or a connector.

This disclosure is intended to explain how to fashion and use various embodiments in accordance with the invention rather than to limit the true, intended, and fair scope and spirit thereof The invention is defined solely by the appended claims, as they may be amended during the pendency of this application for patent, and all equivalents thereof The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A circuit for tuning a digital-controlled oscillator comprising:
   a frequency detector circuit configured to receive a reference clock having a reference frequency and a feedback clock having a feedback frequency, and generate a frequency detection signal and a control clock;
   a digital-controlled oscillator configured to generate the feedback clock based on the frequency detection signal and the control clock,
   wherein the frequency detection signal has a first value when the reference frequency is greater than the feedback frequency, and has a second value when the reference frequency is lower than the feedback frequency,
   wherein the digital-controlled oscillator is configured to use the control clock to trigger a frequency update in the feedback clock,
   wherein a control frequency of the control clock is configured to decrease as the feedback frequency approaches the reference frequency, and
   wherein the frequency detector comprises:
      a phase-frequency detector configured to generate first and second frequency indication signals in response to the reference clock and the feedback clock, the first frequency indication signal being active when a phase of the feedback clock lags behind a reference phase of the reference clock, and the second frequency indication signal being active when the input phase leads the reference phase;
      a first ninety-degree phase shifter configured to generate a first phase-shifted signal in response to the reference clock;
      a second ninety-degree phase shifter configured to generate a second phase-shifted signal in response to the feedback clock;
      a first sample/hold circuit configured to sample and hold the first frequency indication signal as a first sample/hold signal, using the first phase-shifted signal as a first sample clock;
      a second sample/hold circuit configured to sample and hold the second frequency indication signal as a second sample/hold signal, using the second phase-shifted signal as a second sample clock;
      a first inverter configured to invert the first sample/hold signal;
      a second inverter configured to invert the second sample/hold signal;
      a first switch configured to pass the first sample/hold signal as a first latching signal, responsive to the second sample/hold signal;
      a second switch configured to pass the inverted second sample/hold signal as a second latching signal, responsive to the first sample/hold signal;

an AND gate configured to perform an AND operation on the inverted first sample/hold signal and the inverted second sample/hold signal, to generate an AND signal;

a latch circuit configured to latch one of the first and second latching signals as the frequency detection signal, responsive to the AND signal; and a multiplexer configured to provide one of the first and second sample/hold signals as the control clock, responsive to the frequency detection signal.

2. The circuit of claim 1, wherein the multiplexer is configured to provide the first sample/hold signal as the control clock when the frequency detecting signal has the first value, and wherein the multiplexer is configured to provide the second sample/hold signal as the control clock when the frequency detecting signal has the second value.

3. The circuit of claim 1, wherein the first switch is closed, passing the first sample/hold signal as the first latching signal, when the second sample/hold signal has the first value, wherein the first switch is open when the second sample/hold signal has the second value, wherein the second switch is closed, passing the second sample/hold signal as the first latching signal, when the first sample/hold signal has the first value, and wherein the second switch is open when the first sample/hold signal has the second value.

4. A method for tuning a digital-controlled oscillator comprising:

receiving a reference clock signal;

receiving a feedback clock signal from the digital-controlled oscillator;

generating an error signal and a control clock signal in response to a difference between a reference frequency of the reference clock signal and a feedback frequency of the feedback clock signal;

generating the feedback clock signal in response to the error signal and the control clock signal;

wherein the error signal has a first value when the reference frequency is greater than the feedback frequency, wherein the error signal has a second value when the reference frequency is lower than the feedback frequency, wherein a control frequency of the control clock signal is proportional to the difference between the reference frequency and the feedback frequency, and wherein the generating of the error signal and the control clock signal further includes generating a first phase and frequency error signal based on the difference between the reference clock signal and the feedback clock signal;

generating a second phase and frequency error signal based on the difference between the reference clock signal and the feedback clock signal;

shifting the reference clock signal by ninety-degrees to generate a first phase shifted clock signal;

shifting the feedback clock signal by ninety-degrees to generate a second phase shifted clock signal;

generating a first sample/hold signal based on the first phase and frequency error signal and the first phase shifted clock signal;

generating a second sample/hold signal based on the second phase and frequency error signal and the second phase shifted clock;

inverting the first sample/hold signal;

inverting the second sample/hold signal;

generating a first switch signal based on the first and second sample/hold signals;

generating a second switch signal based on the first sample/hold signal and the inverted second sample/hold signal;

performing an AND operation on the inverted first sample/hold signal and the inverted second sample/hold signal to generate an AND signal;

generating the error signal based on the first and second switch signals and the AND signal; and generating the control clock signal based on the first and second sample/hold signals and the error signal.

5. The method of claim 4, wherein the control clock signal is set to be the first sample/hold signal when the error signal has the first value, and wherein the control clock signal is set to be the second sample/hold signal when the error signal has the second value.

6. The method of claim 4, wherein the error signal has the first value when the first switch signal had a high value more recently than the second switch signal had the high value, and wherein the error signal has the second value when the second switch signal had the high value more recently than the first switch signal had the high value.

* * * * *